United States Patent
Rahman et al.

[11] Patent Number: 5,901,310
[45] Date of Patent: May 4, 1999

[54] STORING FIRMWARE IN COMPRESSED FORM

[75] Inventors: Arshad Rahman, Scarborough; Vladimir Velenta, Toronto; Anthony Scarpino, Scarborough, all of Canada

[73] Assignee: ATI Technologies, Inc., Thornhill, Canada

[21] Appl. No.: 08/871,781

[22] Filed: Sep. 11, 1997

[51] Int. Cl.[6] ..................................................... G06F 9/00
[52] U.S. Cl. ........................................ 395/651; 395/653
[58] Field of Search ................................... 395/651, 652, 395/653, 701, 712

[56] References Cited

U.S. PATENT DOCUMENTS 5,671,413  9/1997  Shipman et al. ..................... 395/652

OTHER PUBLICATIONS

Ross, A Simple Data–Compression Technique, The C Users Journal (Oct. 1992).

*Primary Examiner*—Dennis M. Butler
*Attorney, Agent, or Firm*—Markison & Reckamp, P.C.

[57] ABSTRACT

Initializing and configuring computer hardware with firmware stored in compressed form in nonvolatile semiconductor memory. Upon startup of the computer hardware, decompression software decompress the firmware, which is then stored in another memory. The computer hardware may be an adapter board (e.g., a graphics board connected to PCI bus), the nonvolatile semiconductor memory may be physically located on the adapter board, and the firmware may be firmware for initializing and configuring the adapter board. The decompression software may be stored in the same nonvolatile semiconductor memory as the firmware, and may be written in a machine-independent language (e.g., a Forth-based language). The compression technique used may include both run-length encoding and pattern compression, and may operate at the bit level.

34 Claims, 5 Drawing Sheets ns than would
STORING FIRMWARE IN COMPRESSED FORM

BACKGROUND OF THE INVENTION

The invention relates to storing firmware in read only memories (ROM).

Computer systems use ROMs (and other nonvolatile semiconductor memories such as PROMs and EPROMs) to store firmware for use in initializing and configuring a system or system components during the start-up process.

ROMs are available in fixed sizes. In determining the ROM size, the hardware designer accounts for expected firmware revisions that can increase size requirements.

Adapter boards are examples of computer hardware that store firmware in ROMs. These boards are inserted into a computer system and add specific functionality to a system. An example of this is a board that enhances a system's graphics capabilities. When a system powers on or initializes, the system executes the firmware on the adapter board. The firmware typically configures and initializes the adapter board, and serves as a runtime device driver. Developers of adapter boards anticipate firmware upgrades and tend to incorporate ROMs larger than necessary to ensure that the hardware can accommodate future upgrades. Providing a larger ROM bears a greater cost, but reduces the risk that the board has inadequate ROM capacity.

Considering the numerous operating systems and hardware systems on the market, vendors of adapter boards strive for cross-platform compatibility. In doing so, they adopt industry standards.

Peripheral Component Interconnect (PCI) adapter boards conform to the OpenFirmware standard to configure the boards at start-up. They do this via a firmware driver written in FCode, which is a machine-independent language and based on Forth language semantics. The firmware resides in memory on an adaptor board.

Computer systems that support PCI adapter boards and adhere to the OpenFirmware standard provide FCode interpreters. When the host system powers on or initializes, it interprets the FCode program on the adapter board as it reads the program from ROM. The FCode program initializes and configures the adapter board. The program also controls the runtime behavior of the adapter board.

SUMMARY OF THE INVENTION

The invention virtually increases the size of the nonvolatile semiconductor memory (e.g., a ROM) available for storing firmware by storing the firmware in compressed form and quickly decompressing it on startup. This permits the firmware memory to hold more instructions than would otherwise be possible. The invention is able to decompress firmware quickly, reliably, and fully automatically, so that the fact of the firmware being compressed is substantially invisible to the end-user. The invention has cost-saving advantages. It reduces the need to select memories with larger capacities, thereby reducing the cost of the hardware. It also reduces the risk of the firmware exceeding the capacity of the firmware memory.

Preferred implementations of the invention may include one or more of the following features:

The computer hardware may be an adapter board (e.g., a graphics board connected to PCI bus), the nonvolatile semiconductor memory may be physically located on the adapter board, and the firmware may be firmware for initializing and configuring the adapter board.

The firmware may be the BIOS for initializing and configuring a personal computer.

The decompression software may be stored in the same nonvolatile semiconductor memory as the firmware, and may be written in a machine-independent language (e.g., a Forth-based language).

Compression techniques using both run-length encoding and pattern compression may be used (e.g., the Ross Compression technique). The compression technique may scan an input file. First, it may determine if it can perform run-length-encoding compression on the current character. If not, the compression technique may determine if it can compress a pattern of characters. If the run-length-encoding and pattern matching were not successful, the compression technique may copy the character directly to the compressed file. After the technique handles the current character or pattern, it may fetch the next character in the input file. Compression may be done at the bit level (so that each character is a bit).

The compression and decompression may be done with adherence to the OpenFirmware standard. Using the OpenFirmware standard ensures that decompression code written in FCode runs automatically during system start-up, without any user intervention.

Other features and advantages of the invention will become apparent from the following description of preferred embodiments, including the drawings, and from the claims.

DESCRIPTION OF THE PREFERRED EMBODIMENTS

Figure 1:
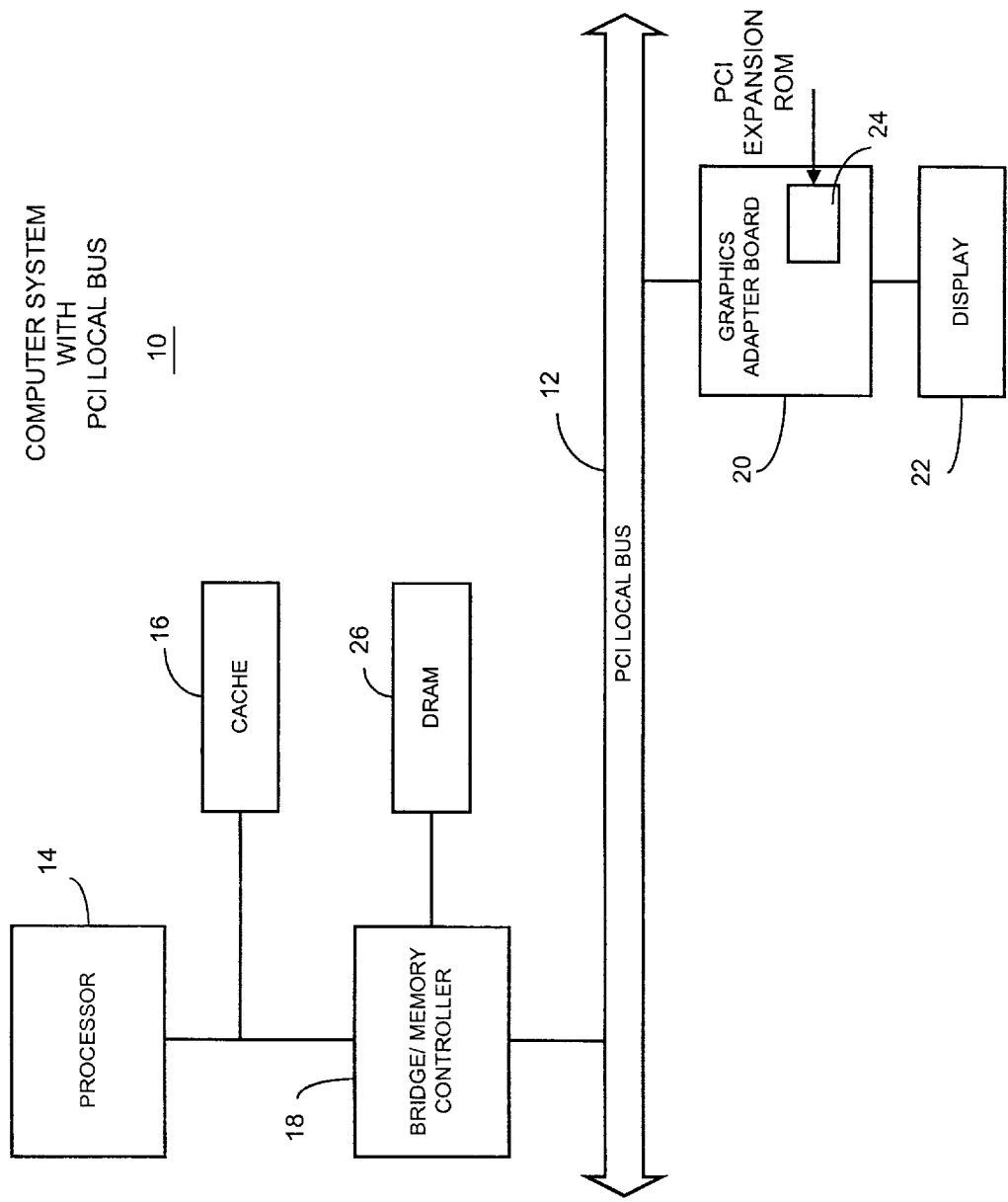
FIG. 1 shows a system architecture with a PCI Local Bus and an adapter board.

Shown in FIG. 1 is a diagram of a basic computer system 10. The computer system contains a processor 14 (CPU), such as an Intel® Pentium® processor, and cache memory 16. The processor accesses devices connected to the PCI local bus 12 through a bridge/memory controller 18. One type of device that may be connected to the PCI local bus is a graphics adapter board 20 that interfaces to a display 22.

Devices that connect to the PCI bus provide initialization code and runtime code for the device. This code resides in ROM 24 on the device. When the computer system starts up or initializes, it detects the device, reads the code from ROM into the host system memory, such as a RAM or dynamic random access memory 26 (DRAM), and interprets the code.

Figure 2:
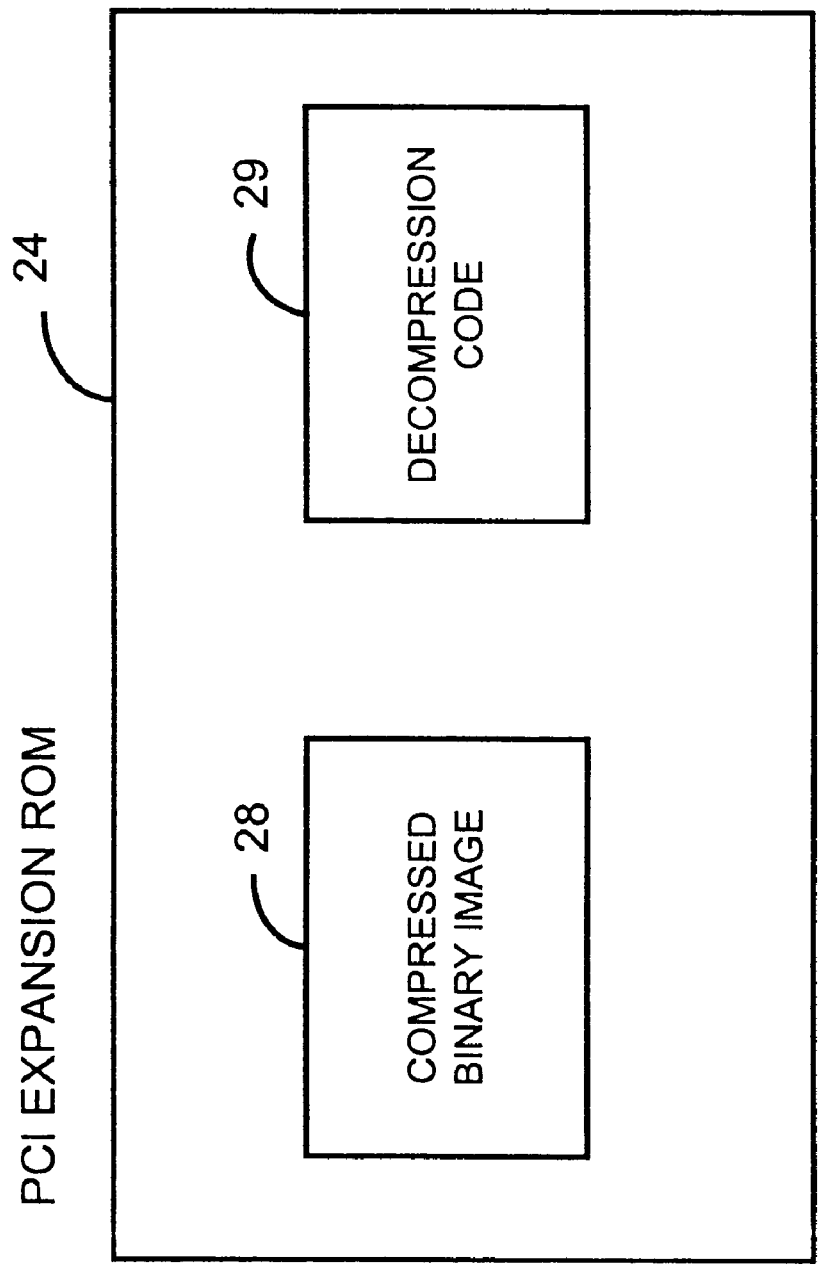
FIG. 2 shows a ROM containing two code images.

Shown in FIG. 2 is a PCI Expansion ROM 24 containing two code images. One image is the compressed binary image 28. This image can contain instructions, such as the adapter board's driver, in a compressed format. The second image is the decompression code 29 for decompressing the compressed binary image. This code is written in FCode, based on Forth language semantics.

When the computer system starts up or initializes, it detects the adapter board connected to the PCI bus. It then locates the decompression code 29 in the adapter board's ROM. The computer system processor runs an FCode interpreter, which interprets the instructions in the decompression program as it reads the code from the adapter board's ROM. The compressed code 28 is decompressed, using the computer system's memory (such as RAM or DRAM 26) to store the image. After the image is decompressed, the system recognizes the decompressed image as a device driver that configures and initializes the adapter board, and supplies the runtime set of instructions for the adapter board.

Figure 3:
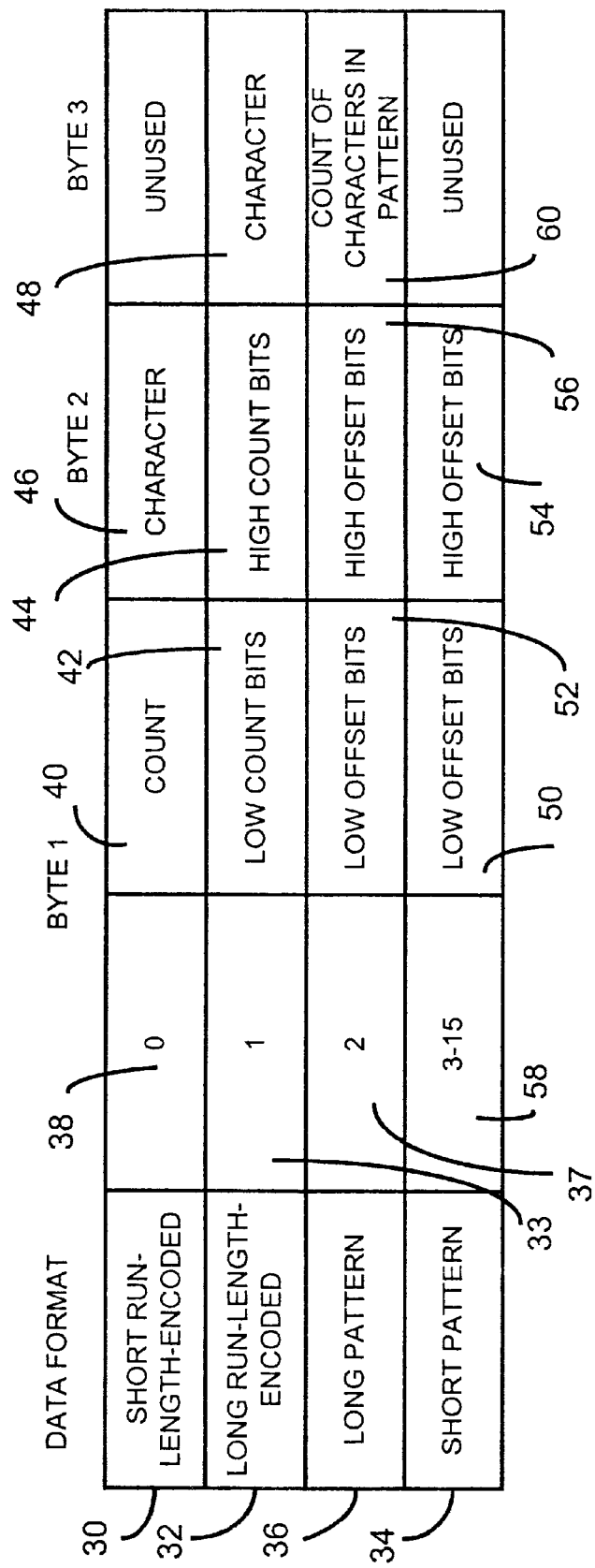
FIG. 3 shows the data structure of the four compressed data formats.

The compression and decompression techniques utilize four 3-byte formats. FIG. 3 illustrates the formats, which are a short run-length-encoded format 30, a long run-length-encoded format 32, a short patterned format 34, and a long patterned format 36.

The high-order bits of the first byte of the 3-byte format specify the type of format (such as 38). The contents of the remaining bits of Byte 1, and Byte 2 and Byte 3, depend on the format type. For short and long run-length-encoded formats, the format contains the number of consecutive identical characters (40, 42, 44) compressed in the item and the character (46, 48). For short and long pattern formats, the format specifies the location of the pattern (50, 52, 54, 56) in the compressed image and the number of characters (58, 60) in the pattern. For short pattern formats, the format type 58 also serves as the pattern length.

Figure 4:
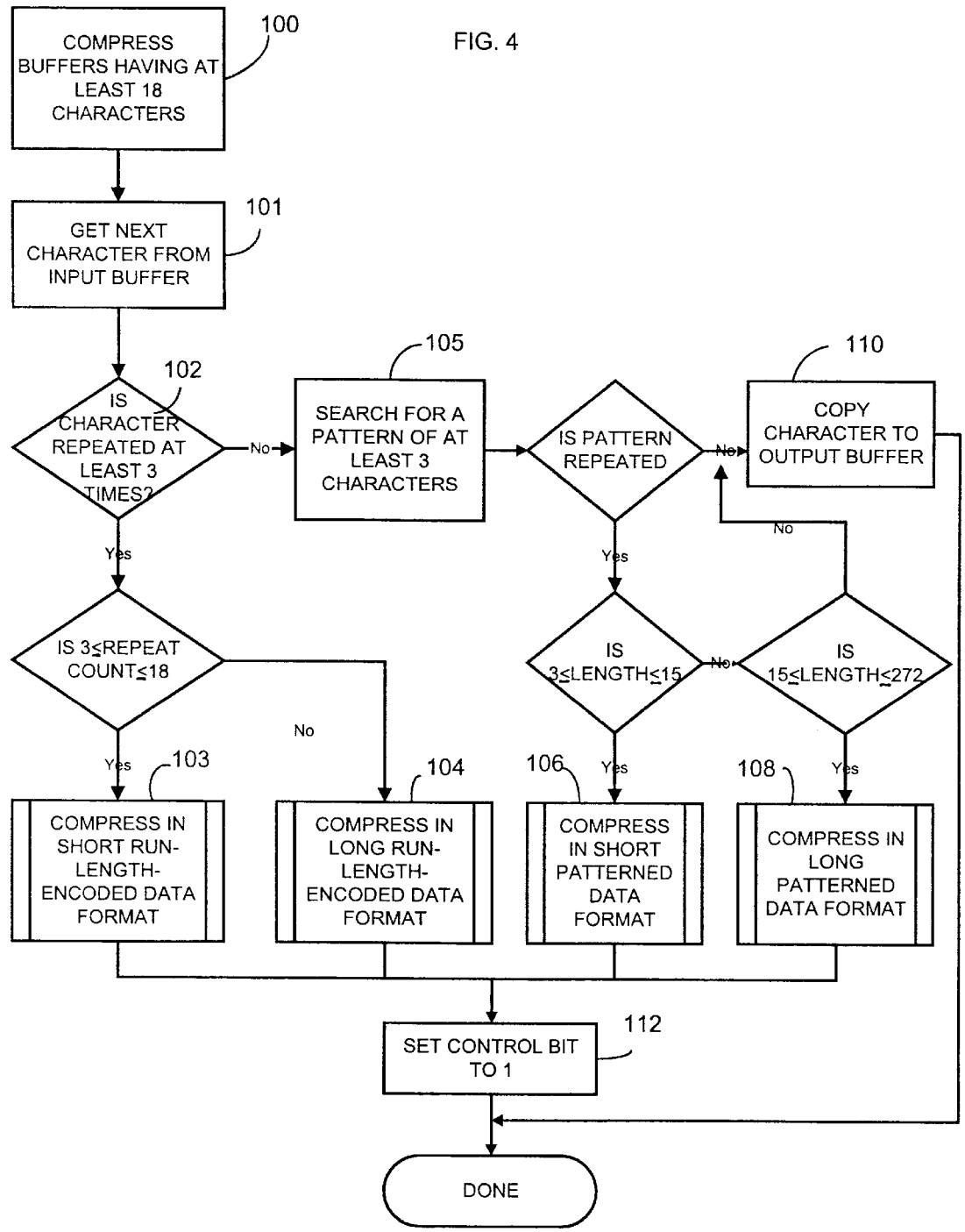
FIG. 4 is a flowchart of the preferred data compression technique.

FIG. 4 shows the main loop of the compression software technique used to prepare the compressed binary image 28. The compression begins when the input buffer contains at least eighteen characters (preferably each character is a single bit) (step 100). The software reads a character (step 101) and determines if it can compress that character with a series of consecutive characters. If the character cannot be compressed, the compression software writes the character directly to the output buffer (step 110).

First, the compression software attempts to run-length-encode the character (step 102). Run-length-encoding surveys a consecutive block of data for a run of identical characters. It counts the number of identical consecutive characters and encodes that block as a character count and the repeated character.

If the character repeats at least three times but no more than eighteen times, the software compresses the character in the short run-length-encoded format 30 (step 103). This format contains the number of consecutive repetitions less three in byte 1 (40). Byte 2 contains the character (46). The number of repetitions is adjusted to fifteen or less, and therefore, the four high-order bits of byte 1 automatically contain a 0 for the format code 38.

If the character repeats more than eighteen times, the software compresses the run of characters in the long run-length-encoded format 32 (step 104). It stores a 1 for the format code in the high-order four bits 33. It stores the four low-order bits of the 12-bit repeat count in the four low-order bits 42 of byte 1. The remaining bits of the repetition count 44 are stored in byte 2, and the character 48 is stored in byte 3.

If the character cannot be run-length-encoded, the software searches for a pattern of characters (step 105). When compressing patterns of characters, a table is used for repeated character patterns. It encodes repeated patterns using an offset that points to another occurrence of the pattern in the data stream.

If a pattern has at least three characters but no more than fifteen, the pattern is compressed in the short pattern format 34 (step 106). This format stores the character count in the four high-order bits 58 of byte 1. This also serves as the format code 58. The four low-order bits of the 12-bit offset index are stored in the low-order bits 50 of byte 1. Remaining offset bits 54 are stored in byte 2.

If a pattern contains sixteen to 271 characters, the software compresses the pattern in the long pattern format 36 (step 107). It stores a 2 for the format code in the four high-order bits 37 of byte 1. It stores the four low-order bits of the 12-bit offset index in the low-order bits 52 of byte 1. The remaining bits 56 of the offset index are stored in byte 2. The number of characters in the pattern 60 are stored in byte 3.

If the run-length-encoding and pattern matching were unsuccessful, the compression software copies the character directly to the compressed file (step 110). A control bit corresponds to each item in the compressed data file. The control bit equals 1 when an item is compressed (step 112). Otherwise, it defaults to 0 when the character is not compressed. After the software handles the current character or pattern, it fetches the next character in the input file.

Figure 5:
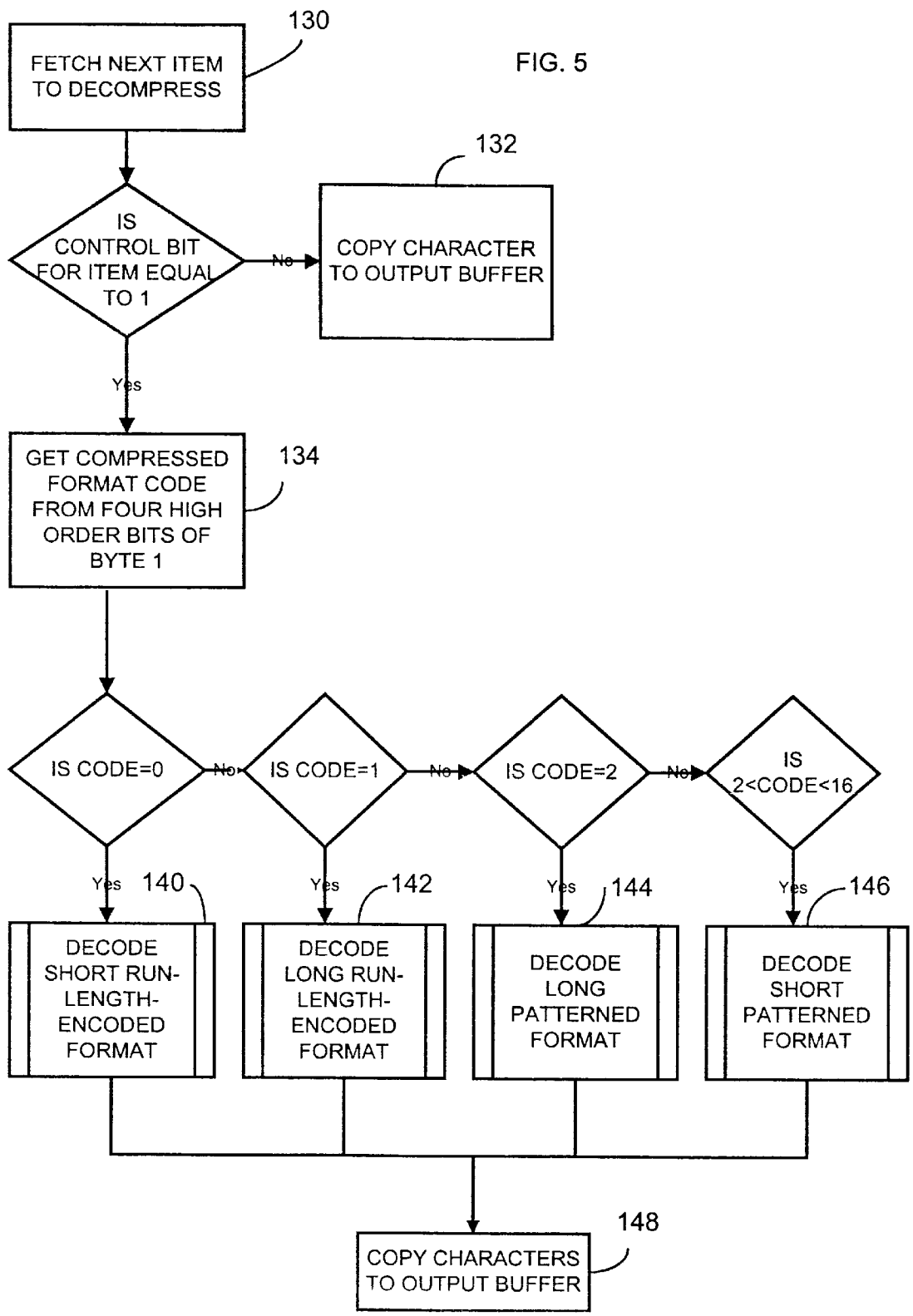
FIG. 5 is a flowchart of the preferred decompression technique.

FIG. 5 shows the main loop of the decompression software technique. The software fetches the next item to decompress (step 130). If the control bit is set to 0, the item is not compressed and the character is copied to the output buffer (step 132). If the control bit is 1, the software reads the format code from the eight high-order bits of byte 1 (step 134).

If the format code is 0, the decompression software decodes the item according to the short run-length-encoded format 30 (step 140). It reads the count 40 from byte 1 and adds three to adjust to the range of three to eighteen. It reads the character 46 from byte 2. The character is decompressed by writing it to the output buffer the number of times specified by the count.

If the format code is 1, the item is decoded according to the long run-length-encoded format 32 (step 142). Byte 2 of the compressed item 44 and the low order bits 42 of byte 1 specify the count. The character count is increased by nineteen to adjust to the range of nineteen to 4114. Then the character is decompressed by writing it to the output buffer the number of times specified by the count (step 148).

If the format code is 2, the decompression technique decodes the item according to the long patterned format 36 (step 144). Byte 2 (56) and the four low-order bits 52 of byte 1 determine the repeated pattern location. Byte 3 (60) specifies the number of characters in the pattern. The technique reads the specified number of characters starting at the repeated pattern location and copies them into the output buffer (step 148).

If the format code is greater than 2 and less than 16, the decompression software decodes the item according to the short patterned format 34 (step 146). The format code 58 also specifies the number of characters in the repeated pattern. Byte 2 (54) and the low-order bits 50 of byte 1 specify the location of the repeated pattern. The technique reads the specified number of characters starting at the repeated pattern location and copies them into the output buffer (step 148).

The attached Appendix contains the source code for the compression and decompression, respectively.

Other embodiments are within the scope of the following claims. For example, a personal computer's basic input/output system (BIOS) is firmware stored in ROM and could be stored in a compressed format. Furthermore, other types of nonvolatile semiconductor memory, such as programmable ROMs (PROMS) and erasable programmable ROMs (EPROMs), could be used to store the compressed firmware.

We claim:

1. A method for initializing and configuring computer hardware with firmware read from nonvolatile semiconductor memory, the method comprising storing compressed runtime device driver firmware in compressed form in nonvolatile semiconductor memory different from nonvolatile BIOS memory;

upon startup of the computer hardware, executing decompression software to decompress the firmware stored in the nonvolatile semiconductor memory;

storing the decompressed firmware in a memory other than the nonvolatile semiconductor memory.

2. The method of claim 1 wherein the nonvolatile semiconductor memory comprises a memory selected from the group consisting of a ROM, PROM, or EPROM.

3. The method of claim 1 wherein the computer hardware comprises an adapter board, the nonvolatile semiconductor memory is physically located on the adapter board, and the compressed runtime device driver firmware comprises firmware for initializing and configuring the adapter board.

4. The method of claim 3 wherein the adapter board comprises a graphics board, and the compressed runtime device driver firmware comprises a runtime device driver for the graphics board.

5. The method of claim 3 wherein the adapter board is connected to a personal computer via a PCI bus.

6. The method of claim 1 wherein the decompression software is stored in the same nonvolatile semiconductor memory as the firmware.

7. The method of claim 6 wherein the decompression software is written in a machine-independent language.

8. The method of claim 7 wherein the machine-independent language is Forth-based.

9. The method of claim 1 wherein the firmware has been compressed using a compression method that comprises run-length encoding.

10. The method of claim 9 wherein the compression method further comprises pattern compression; and wherein run-length encoding is employed if a character is repeated more than a predetermined number of times; and pattern compression is used if run-length encoding is not used and a repeated pattern is recognized.

11. The method of claim 10 wherein a character is stored without compression if neither run-length encoding nor pattern compression is used.

12. The method of claim 1 wherein the compression method is a bit-level method.

13. The method of claim 1 wherein the nonvolatile semiconductor memory comprises a memory selected from the group consisting of a ROM, PROM, or EPROM;

the computer hardware comprises an adapter board, the nonvolatile semiconductor memory is physically located on the adapter board, and the compressed runtime device driver firmware comprises firmware for initializing and configuring the adapter board;

the adapter board comprises a graphics board, and the compressed runtime device driver firmware comprises a runtime device driver for the graphics board.

14. The method of claim 13 wherein the decompression software is stored in the same nonvolatile semiconductor memory as the firmware.

15. The method of claim 14 wherein the decompression software is written in a machine-independent language.

16. The method of claim 15 wherein the firmware has been compressed using a bit-level compression method that comprises run-length encoding.

17. The method of claim 16 wherein the compression method further comprises pattern compression; and wherein run-length encoding is employed if a character is repeated more than a predetermined number of times;

pattern compression is used if run-length encoding is not used and a repeated pattern is recognized.

18. A computer system comprising firmware for initializing and configuring computer hardware, wherein the firmware is read from nonvolatile semiconductor memory, the system comprising means for storing compressed runtime device driver firmware in compressed form in the nonvolatile semiconductor memory different from nonvolatile BIOS memory;

means for, upon startup of the computer hardware, executing decompression software to decompress the firmware stored in the nonvolatile semiconductor memory;

means for storing the decompressed firmware in a memory other than the nonvolatile semiconductor memory.

19. The computer system of claim 18 wherein the nonvolatile semiconductor memory comprises a memory selected from the group consisting of a ROM, PROM, or EPROM.

20. The computer system of claim 18 wherein the computer hardware comprises an adapter board, the nonvolatile semiconductor memory is physically located on the adapter board, and the compressed runtime device driver firmware comprises firmware for initializing and configuring the adapter board.

21. The computer system of claim 20 wherein the adapter board comprises a graphics board, and the compressed runtime device driver firmware comprises a runtime device driver for the graphics board.

22. The computer system of claim 20 wherein the adapter board is connected to a personal computer via a PCI bus.

23. The computer system of claim 18 wherein the decompression software is stored in the same nonvolatile semiconductor memory as the firmware.

24. The computer system of claim 23 wherein the decompression software is written in a machine-independent language.

25. The computer system of claim 24 wherein the machine-independent language is Forth-based.

26. The computer system of claim 18 wherein the firmware has been compressed using a compression method that comprises run-length encoding.

27. The computer system of claim 26 wherein the compression method further comprises pattern compression; and wherein run-length encoding is employed if a character is repeated more than a predetermined number of times; and pattern compression is used if run-length encoding is not used and a repeated pattern is recognized.

28. The computer system of claim 27 wherein a character is stored without compression if neither run-length encoding nor pattern compression is used.

29. The computer system of claim 18 wherein the compression method is a bit-level method.

30. The computer system of claim 18 wherein the nonvolatile semiconductor memory comprises a memory selected from the group consisting of a ROM, PROM, or EPROM;

the computer hardware comprises an adapter board, the nonvolatile semiconductor memory is physically located on the adapter board, and the compressed runtime device driver firmware comprises firmware for initializing and configuring the adapter board;

the adapter board comprises a graphics board, and the compressed runtime device driver firmware comprises a runtime device driver for the graphics board.

31. The computer system of claim 30 wherein the decompression software is stored in the same nonvolatile semiconductor memory as the firmware.

32. The computer system of claim 31 wherein the decompression software is written in a machine-independent language.

33. The computer system of claim 32 wherein the firmware has been compressed using a bit-level compression method that comprises run-length encoding.

34. The computer system of claim 33 wherein the compression method further comprises pattern compression; and wherein run-length encoding is employed if a character is repeated more than a predetermined number of times;

pattern compression is used if run-length encoding is not used and a repeated pattern is recognized.

* * * * *